United States Patent
Parikh

(10) Patent No.: US 7,434,082 B2
(45) Date of Patent: Oct. 7, 2008

(54) MULTI-STAGE CLOCK SELECTOR

(75) Inventor: Parag Parikh, Allentown, PA (US)

(73) Assignee: Agere Systems Inc., Allentown, PA (US)

(*) Notice: Subject to any disclaimer, the term of this patent is extended or adjusted under 35 U.S.C. 154(b) by 432 days.

(21) Appl. No.: 11/240,290

(22) Filed: Sep. 30, 2005

(65) Prior Publication Data

US 2007/0079165 A1 Apr. 5, 2007

(51) Int. Cl.
G06F 1/04 (2006.01)

(52) U.S. Cl. .................. 713/501; 713/400; 713/503

(58) Field of Classification Search ......... 713/400–501, 713/503, 600
See application file for complete search history.

(56) References Cited

U.S. PATENT DOCUMENTS

| | | | | |
|---|---|---|---|---|
| 5,515,403 A | * | 5/1996 | Sloan et al. ............... | 375/371 |
| 5,778,217 A | * | 7/1998 | Kao ........................... | 713/503 |
| 6,310,498 B1 | * | 10/2001 | Larsson ...................... | 327/158 |
| 6,901,126 B1 | * | 5/2005 | Gu .............................. | 375/355 |
| 2001/0018751 A1 | * | 8/2001 | Gresham .................... | 713/401 |
| 2002/0105386 A1 | * | 8/2002 | Shastri ....................... | 331/11 |

* cited by examiner

Primary Examiner—Dennis M Butler
(74) Attorney, Agent, or Firm—Mendelsohn & Associates, P.C.; Kevin M. Drucker; Steve Mendelsohn

(57) ABSTRACT

A clock selector for selecting a set of candidate clock signals from among a plurality of input clock signals. The phase selector includes control logic adapted to generate a plurality of control signals and a plurality of muxes controlled by the control signals and arranged in two or more stages having at least a first stage and a last stage. The input to the first stage is the plurality of input clock signals. At least one stage is adapted to (i) receive a plurality of clock signals, (ii) drop at least the first or the last clock signal of the received plurality of clock signals, and (iii) output a reduced plurality of clock signals. The output of the last stage is the set of candidate clock signals.

50 Claims, 10 Drawing Sheets

FIG. 4

| k (STARTING PHASE NO.) | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| BINARY k | 00000 | 00001 | 00010 | 00011 | 00100 | 00101 | 00110 | 00111 | 01000 | 01001 | 01010 | 01011 | 01100 | 01101 | 01110 | 01111 |
| SEL[6:0] | 0000000 | 0000010 | 0000100 | 0000110 | 0001000 | 0001010 | 0001100 | 0001110 | 1101111 | 1101101 | 1101011 | 1101001 | 1100111 | 1100101 | 1100011 | 1100001 |

| k (STARTING PHASE NO.) | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|
| BINARY k | 10000 | 10001 | 10010 | 10011 | 10100 | 10101 | 10110 | 10111 | 11000 | 11001 | 11010 | 11011 | 11100 | 11101 | 11110 | 11111 |
| SEL[6:0] | 0110000 | 0110010 | 0110100 | 0110110 | 0111000 | 0111010 | 0111100 | 0111110 | 1011111 | 1011101 | 1011011 | 1011001 | 1010111 | 1010101 | 1010011 | 1010001 |

FIG. 9

| k (STARTING PHASE NO.) | 0 | 1 | 2 | 3 | 4 | 5 | 6 | 7 | 8 | 9 | 10 |
|---|---|---|---|---|---|---|---|---|---|---|---|
| SEL[0:9] | 0000000000 | 1000000000 | 1100000000 | 1110000000 | 1111000000 | 1111100000 | 1111110000 | 1111111000 | 1111111100 | 1111111110 | 1111111111 |

EXAMPLE 1: k=0 (SEL[6:0]=0000000)

| STAGE 0 | | STAGE 1 | | STAGE 2 | | STAGE 3 | | STAGE 4 | | STAGE 5 | |
|---|---|---|---|---|---|---|---|---|---|---|---|
| Mux | Output | Mux | Output | Mux | Output | Mux | Output | Mux | Output | Mux | Output |
| 300(1) | C[0:7] | 301(1) | C[0:7] | 302(1) | C[0:3] | 303(1) | C[0:1] | 304(1) | C[0] | 305(1) | C[0] |
| 300(2) | C[16:23] | 301(2) | C[8:15] | 302(2) | C[4:7] | 303(2) | C[2:3] | 304(2) | C[1] | 305(2) | C[1] |
| 300(3) | C[8:15] | | | 302(3) | C[8:11] | 303(3) | C[4:5] | 304(3) | C[2] | 305(3) | C[2] |
| 300(4) | C[24:31] | | | | | 303(4) | C[6:7] | 304(4) | C[3] | 305(4) | C[3] |
| | | | | | | 303(5) | C[8:9] | 304(5) | C[4] | 305(5) | C[4] |
| | | | | | | | | 304(6) | C[5] | 305(6) | C[5] |
| | | | | | | | | 304(7) | C[6] | 305(7) | C[6] |
| | | | | | | | | 304(8) | C[7] | 305(8) | C[7] |
| | | | | | | | | 304(9) | C[8] | | |

FIG. 5(a)

EXAMPLE 2: k=9 (SEL[6:0]=1101101)

| STAGE 0 | | STAGE 1 | | STAGE 2 | | STAGE 3 | | STAGE 4 | | STAGE 5 | |
|---|---|---|---|---|---|---|---|---|---|---|---|
| Mux | Output | Mux | Output | Mux | Output | Mux | Output | Mux | Output | Mux | Output |
| 300(1) | C[7:0] | 301(1) | C[23:16] | 302(1) | C[19:16] | 303(1) | C[17:16] | 304(1) | C[17] | 305(1) | C[16] |
| 300(2) | C[23:16] | 301(2) | C[15:8] | 302(2) | C[15:12] | 303(2) | C[15:14] | 304(2) | C[16] | 305(2) | C[15] |
| 300(3) | C[15:8] | | | 302(3) | C[11:8] | 303(3) | C[13:12] | 304(3) | C[15] | 305(3) | C[14] |
| 300(4) | C[31:24] | | | | | 303(4) | C[11:10] | 304(4) | C[14] | 305(4) | C[13] |
| | | | | | | 303(5) | C[9:8] | 304(5) | C[13] | 305(5) | C[12] |
| | | | | | | | | 304(6) | C[12] | 305(6) | C[11] |
| | | | | | | | | 304(7) | C[11] | 305(7) | C[10] |
| | | | | | | | | 304(8) | C[10] | 305(8) | C[9] |
| | | | | | | | | 304(9) | C[9] | | |

FIG. 5(b)

EXAMPLE 3: k=26 (SEL[6:0]=1011011)

| STAGE 0 | | STAGE 1 | | STAGE 2 | | STAGE 3 | | STAGE 4 | | STAGE 5 | |
|---|---|---|---|---|---|---|---|---|---|---|---|
| Mux | Output | Mux | Output | Mux | Output | Mux | Output | Mux | Output | Mux | Output |
| 300(1) | C[7:0] | 301(1) | C[7:0] | 302(1) | C[3:0] | 303(1) | C[3:2] | 304(1) | C[2] | 305(1) | C[1] |
| 300(2) | C[23:16] | 301(2) | C[31:24] | 302(2) | C[31:28] | 303(2) | C[1:0] | 304(2) | C[1] | 305(2) | C[0] |
| 300(3) | C[15:8] | | | 302(3) | C[27:24] | 303(3) | C[31:30] | 304(3) | C[0] | 305(3) | C[31] |
| 300(4) | C[31:24] | | | | | 303(4) | C[29:28] | 304(4) | C[31] | 305(4) | C[30] |
| | | | | | | 303(5) | C[27:26] | 304(5) | C[30] | 305(5) | C[29] |
| | | | | | | | | 304(6) | C[29] | 305(6) | C[28] |
| | | | | | | | | 304(7) | C[28] | 305(7) | C[27] |
| | | | | | | | | 304(8) | C[27] | 305(8) | C[26] |
| | | | | | | | | 304(9) | C[26] | | |

FIG. 5(c)

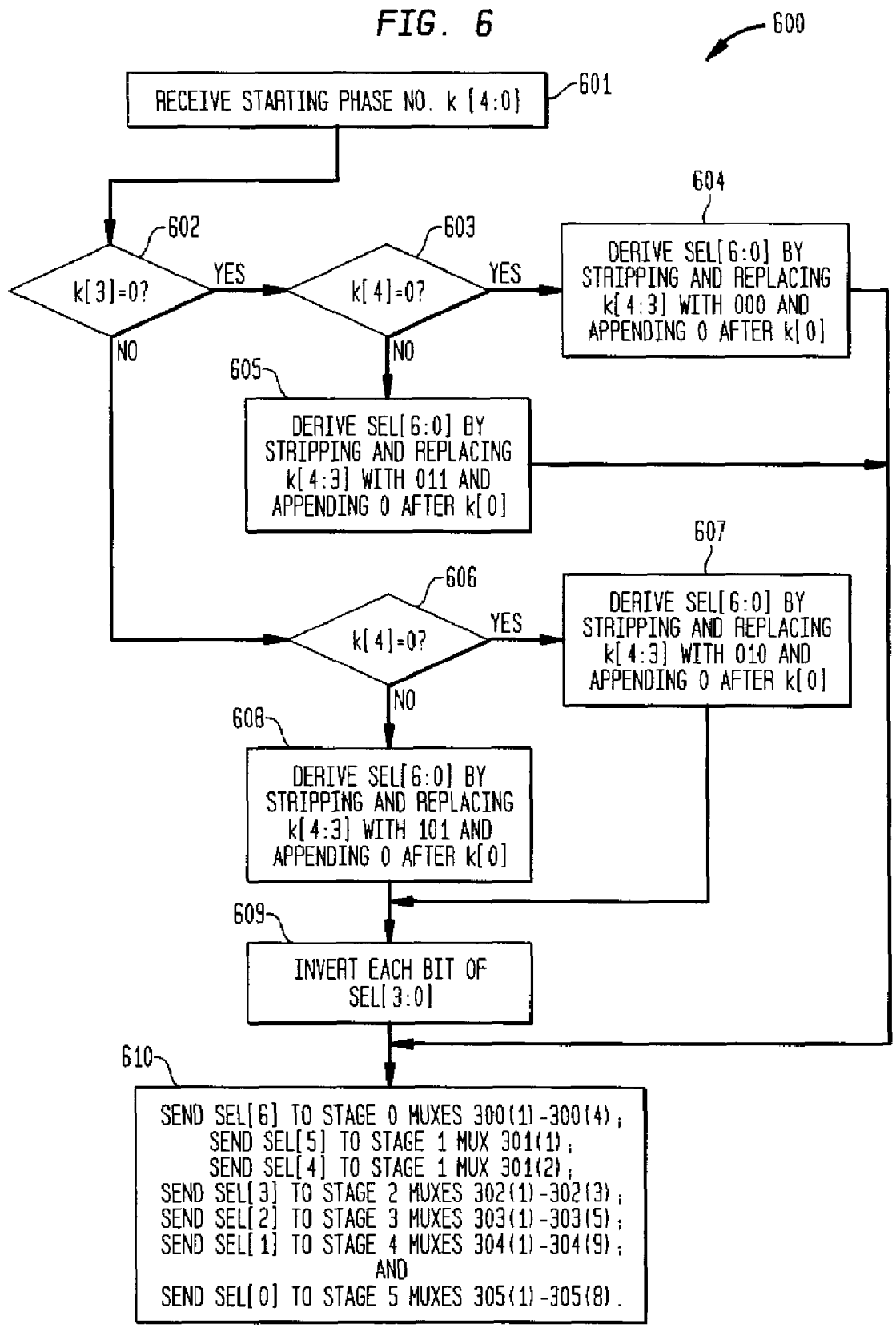

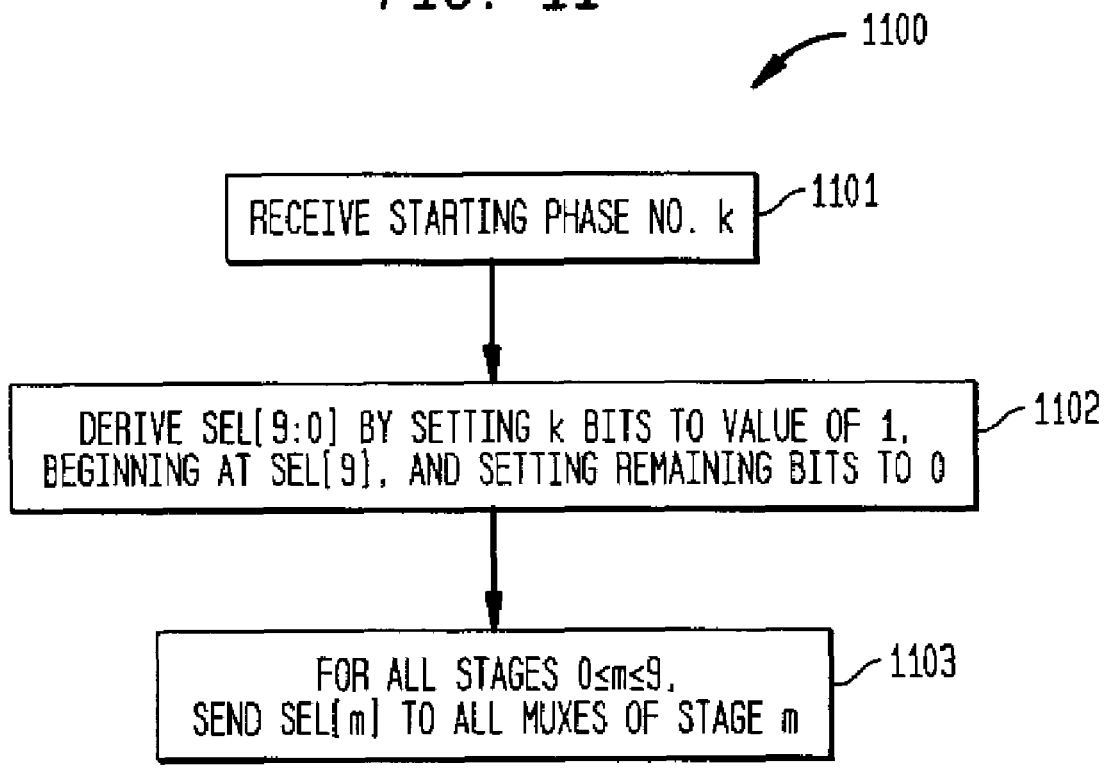

US 7,434,082 B2

MULTI-STAGE CLOCK SELECTOR

BACKGROUND OF THE INVENTION

1. Field of the Invention

The present invention relates, generally, to digital timing schemes, and more particularly, to the selection of a set of clock signals from among a plurality of input clock signals.

2. Description of the Related Art

A wide array of applications involving serial communication between devices (e.g., chip-to-chip, peripheral I/O, and processor-to-processor communication) employ a clock-and-data recovery (CDR) circuit to recover a clock signal from a received asynchronous data signal, and the recovered clock signal is then used to sample the received data signal. A typical CDR circuit recovers a clock signal, e.g., using a phase-locked loop (PLL) to lock the phase of a reference clock signal to the phase of the received data signal. A CDR circuit typically selects the reference clock signal by comparing the phase of the received data signal with the phases of a set of candidate clock signals, which may represent, e.g., time-shifted or interleaved phases of a single clock signal. After determining the reference clock signal, the CDR circuit re-times the received data based on the reference clock signal.

FIG. 1 illustrates an exemplary plurality of time-shifted input clock signals C[0:31] from which a set of candidate clock signals might be selected, wherein consecutive input clock signals are uniformly time-shifted relative to one another. The selected set of candidate clock signals generally comprises clock signals that are consecutive. For example, a selection of 8 consecutive input clock signals from among input clock signals C[0:31] starting with input clock signal C[10] results in the set of candidate clock signals C[10:17]. The word "consecutive," as used herein, includes the case in which two or more candidate clock signals are selected from a plurality of input clock signals, wherein the bit reference numerals of the two or more selected candidate clock signals are consecutive integers, e.g., C[0:5] or C[22:23]. It should be noted that candidate clock signals C[0:31] "wrap around" so that input clock signal C[0] is considered to be consecutive with C[31]. That is to say, all of the input clock signals are evenly distributed over 360 degrees, such that not only are consecutive input clock signals uniformly time-shifted relative to one another, but the last input clock signal C[31] and the first input clock signal C[0] are uniformly time-shifted relative to one another, as well. Accordingly, the word "consecutive," as used herein, should be understood to include the case in which the set of candidate clock signals includes both C[0] and C[31], which are still considered to be consecutive, even though their respective bit reference numerals are not consecutive integers.

FIG. 2 illustrates a prior-art phase selector 220, as might typically be used to select and provide to a CDR circuit a set of consecutive candidate clock signals from among a plurality of input clock signals. As shown, phase selector 220 comprises a controller 250 and a set of 32:1 multiplexers (muxes) 202(0)-202(7). Each mux 202(i) receives all 32 input clock signals and outputs only a single (candidate) clock signal out[i], based on a 5-bit selection signal sel(i)[4:0] generated by controller 250. Controller 250 contains logic for receiving a starting phase number k (e.g., supplied by the CDR circuit) and calculating the values of selection signals Sel(0)[4:0]-Sel(7)[4:0] to be provided concurrently to muxes 202(0)-202(7). Controller 250 sends selection signal Sel(0)[4:0] to mux 202(0), so that mux 202(0) selects input clock signal C[k]. At the same time, controller 250 sends selection signal Sel(1)[4:0] to mux 202(1), so that mux 202(1) selects input clock signal C[k+1]. At the same time, controller 250 sends selection signal Sel(2)[4:0] to mux 202(2), so that mux 202(2) selects input clock signal C[k+2], and so forth.

Disadvantageously, in phase selector 220, all 32 input clock signals C[0:31] are routed to each different 32:1 muxes 202(i), and a different 5-bit control signal Sel(i)[4:0] is routed to each mux 202(i), thereby employing a relatively large physical layout area, consuming much power, and having a large fanout. Fanout refers to the number of outputs that can be driven by a logic circuit.

Moreover, relatively complex logic may need to be provided for handling the "wrap-around" case, since input clock signals C[0:31] are evenly distributed over 360 degrees, so that, e.g., if the set of output clock signals out[0]-out[7] includes both C[31] and C[0], the selection of input clock signals will cause one or more upper muxes to select input clock signals up to and including C[31] and one or more lower muxes to select input clock signals starting from and including C[0].

Furthermore, in many applications, the total number of clock signals to select is significantly larger than in the example of FIG. 2, such as selecting 20 out of 100 input clock signals, which would involve a significantly large layout area and fanout and would consume significant power to route all 100 clock signals to each of 20 different muxes and a different 7-bit control signal to each of the 20 muxes.

The technique of phase selection is also used in a variety of applications other than digital timing recovery, e.g., serial-to-parallel data conversion, and there is a need for a low-power phase selector that permits selection of a set of clock signals embodying consecutive phases from among a number of input clock signals, without requiring significant layout area or fanout.

SUMMARY OF THE INVENTION

Problems in the prior art are addressed in accordance with the principles of the present invention by providing phase selectors that exploit the physical positions of a plurality of muxes to minimize layout area and fanout and significantly reduce the logic used to generate and provide control signals to the muxes.

In one embodiment, the present invention provides a clock selector for selecting a set of candidate clock signals from among a plurality of input clock signals. The phase selector includes control logic adapted to generate a plurality of control signals and a plurality of muxes controlled by the control signals and arranged in two or more stages having at least a first stage and a last stage. The input to the first stage is the plurality of input clock signals. At least one stage is adapted to (i) receive a plurality of clock signals, (ii) drop at least the first or the last clock signal of the received plurality of clock signals, and (iii) output a reduced plurality of clock signals. The output of the last stage is the set of candidate clock signals.

In another embodiment, the present invention provides a method of selecting a set of candidate clock signals from among a plurality of input clock signals. The method includes: generating a plurality of control signals, and controlling a plurality of muxes using the control signals. The muxes are arranged in two or more stages having at least a first stage and a last stage. The input to the first stage is the plurality of input clock signals. At least one stage is adapted to (i) receive a plurality of clock signals, (ii) drop at least the first or the last clock signal of the received plurality of clock signals, and (iii) output a reduced plurality of clock signals. The output of the last stage is the set of candidate clock signals.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 4 is a table illustrating the control signals that are generated by the controller and provided to the muxes in the phase selector of FIG. 3;

FIGS. 5(a)-(c) show three tables illustrating the clock signals output by the muxes of the phase selector of FIG. 3 for three exemplary starting phase-number values, respectively;

FIG. 6 is a flowchart illustrating an exemplary algorithm for controlling the muxes of the phase selector of FIG. 3;

FIG. 9 is a table illustrating the control signals that are generated by the controller and provided to the muxes in the phase selector of FIG. 8;

FIGS. 10(a)-(b) show two tables illustrating the clock signals output by the muxes of the phase selector of FIG. 8 for two exemplary starting phase-number values, respectively; and FIG. 11 is a flowchart illustrating an exemplary algorithm for controlling the muxes of the phase selector of FIG. 8.

DETAILED DESCRIPTION

Figure 1:
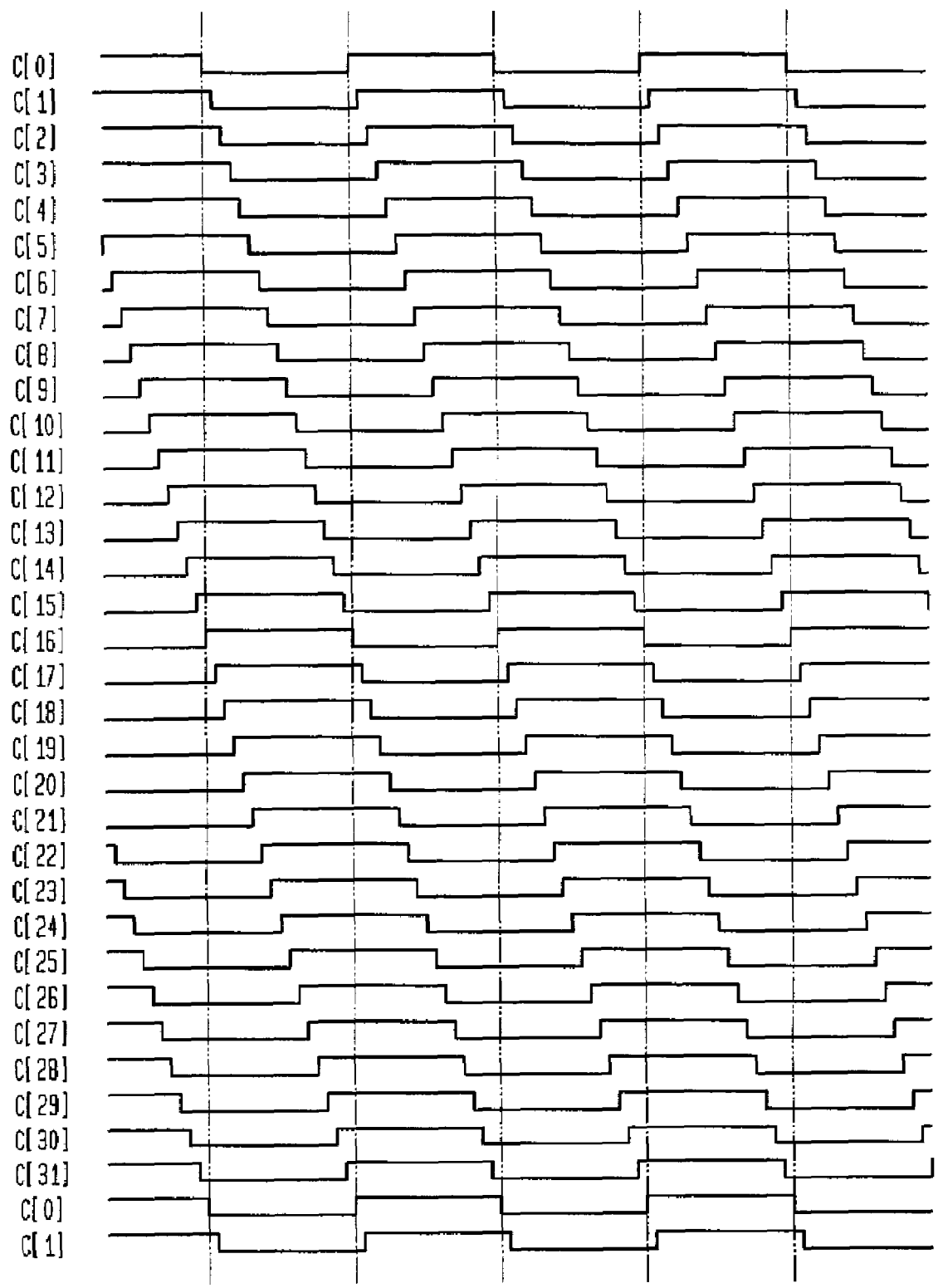
FIG. 1 is a timing diagram illustrating an exemplary plurality of time-shifted input clock signals from which a set of candidate clock signals might be selected, wherein the input clock signals are evenly distributed over 360 degrees.
Figure 3:
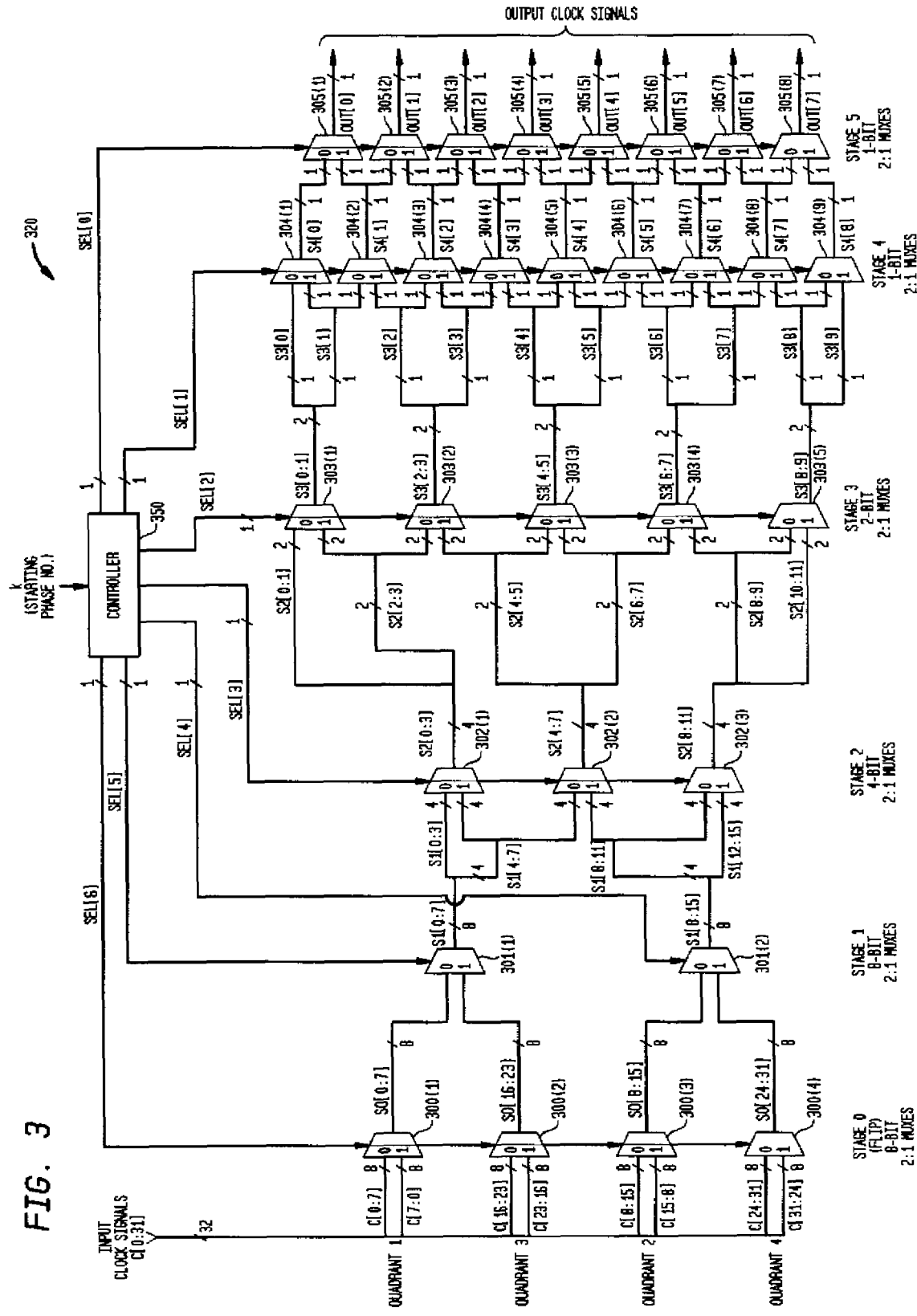
FIG. 3 is a block diagram of an exemplary phase selector consistent with a first embodiment of the present invention.

FIG. 3 illustrates an exemplary phase selector 320 consistent with a first embodiment of the present invention. In this example, phase selector 320 is arranged to select 8 consecutive clock signals from a set of 32 input clock signals evenly distributed over 360 degrees (i.e., the signals "wrap around," as shown in FIG. 1). An external circuit provides starting phase number k to specify that the desired 8 consecutive input clock signals are C[k] through C[MOD((k+7),32)]. The function MOD is a modulo function that returns the remainder from applying an integer division by 32 to k+7. For example, if k=30, then the desired 8 consecutive input clock signals are C[30] through. C[MOD((30+7),32)], i.e., C[30], C[31], C[0], C[1], C[2], C[3], C[4], and C[5].

As shown, phase selector 320 comprises a controller 350 and a plurality of muxes (300(1)-300(4), 301(1) and 301(2), 302(1)-302(3), 303(1)-303(5), 304(1)-304(9), and 305(1)-305(8)) arranged as 6 different stages, numbered 0 to 5. Stage 0 (the "flip" stage) comprises 8-bit 2:1 muxes 300(1)-300(4), stage 1 comprises 8-bit 2:1 muxes 301(1) and 301(2), stage 2 comprises 4-bit 2:1 muxes 302(1)-302(3), stage 3 comprises 2-bit 2:1 muxes 303(1)-303(5), stage 4 comprises 1-bit 2:1 muxes 304(1)-304(9), and stage 5 comprises 1-bit 2:1 muxes 305(1)-305(8).

An n-bit 2:1 mux (i) receives one n-bit input signal at its "0" input and another n-bit input signal at its "1" input and (ii) provides one of these two n-bit input signals as its n-bit output signal based on the value of a 1-bit control signal Sel applied to its control input, as follows. If Sel=0, then the "0" input signal is selected. If Sel=1, then the "1" input signal is selected.

As shown in FIG. 3, within each stage, the muxes are desirably arranged linearly and adjacent to one another, and the connections between the various muxes have short physical routing, so as to reduce power consumption of phase selector 320, as well as to reduce layout area and fanout. Controller 350 receives starting phase number k and implements an algorithm that uses starting phase number k to generate seven corresponding control signals Sel[i] for controlling stage-0 muxes 300(1)-300(4), stage-1 mux 301(1), stage-1 mux 301(2), stage-2 muxes 302(1)-302(3), stage-3 muxes 303(1)-303(5), stage-4 muxes 304(1)-304(9), and stage-5 muxes 305(1)-305(8), respectively.

The plurality of received input clock signals C[0:31] are physically separated into 4 quadrants: C[0:7], C[8:15], C[16:23], and C[24:31].

In stage 0 (the "flip" stage), the set of first-quadrant signals C[0:7] is provided to the "0" input of mux 300(1), a "flipped" (reverse-ordered) set C[7:0] of first-quadrant signals C[0:7] is provided to the "1" input of mux 300(1), and mux 300(1) outputs signal S0[0:7]. The set of second-quadrant signals C[8:15] is provided to the "0" input of mux 300(3), a "flipped" set C[15:8] of second-quadrant signals C[8:15] is provided to the "1" input of mux 300(3), and mux 300(3) outputs signal S0[8:15]. The set of third-quadrant signals C[16:23] is provided to the "0" input of mux 300(2), a "flipped" set C[23:16] of third-quadrant signals C[16:23] is provided to the "1" input of mux 300(2), and mux 300(2) outputs signal S0[16:23]. The set of fourth-quadrant signals C[24:31] is provided to the "0" input of mux 300(4), a "flipped" set C[31:24] of fourth-quadrant signals C[24:31] is provided to the "1" input of mux 300(4), and mux 300(4) outputs signal S0[24:31]. All four muxes 300(1)-300(4) receive signal Sel[6] from controller 350.

In stage 1, signal S0[0:7] is provided to the "0" input of mux 301(1), signal S0[16:23] is provided to the "1" input of mux 301(1), and mux 301(1) outputs signal S1[0:7]. Signal S0[8:15] is provided to the "0" input of mux 301(2), signal S0[24:31] is provided to the "1" input of mux 301(2), and mux 301(2) outputs signal S1[8:15]. Mux 301(1) receives signal Sel[5] from controller 350.

Between stage 1 and stage 2, 8-bit stage-1 output signal S1[0:7] is split into 4-bit signals S1[0:3] and S1[4:7]. Similarly, 8-bit stage-1 output signal S1[8:15] is split into 4-bit signals S1[8:11] and S1[12:15].

In stage 2, signal S1[0:3] is provided to the "0" input of mux 302(1). Signal S1[4:7] is provided to the "1" input of mux 302(1) and the "0" input of mux 302(2). Signal S1[8:11] is provided to the "1" input of mux 302(2) and the "0" input of mux 302(3). Signal S1[12:15] is provided to the "1" input of mux 302(3). Mux 302(1) outputs signal S2[0:3], mux 302(2) outputs signal S2[4:7], and mux 302(3) outputs signal S2[8:11]. Muxes 302(1)-302(3) receive signal Sel[3] from controller 350.

Between stage 2 and stage 3, 4-bit stage-2 output signal S2[0:3] is split into 2-bit signals S2[0:1] and S2[2:3]. Similarly, 4-bit stage-2 output signal S2[4:7] is split into 2-bit signals S2[4:5] and S2[6:7], and 4-bit stage-2 output signal S2[8:11] is split into 2-bit signals S2[8:9] and S2[10:11].

In stage 3, signal S2[0:1] is provided to the "0" input of mux 303(1). Signal S2[2:3] is provided to the "1" input of mux 303(1) and the "0" input of mux 303(2). Signal S2[4:5] is provided to the "1" input of mux 303(2) and the "0" input of mux 303(3). Signal S2[6:7] is provided to the "1" input of mux 303(3) and the "0" input of mux 303(4). Signal S2[8:9] is provided to the "1" input of mux 303(4) and the "0" input of mux 303(5). Signal S2[10:11] is provided to the "1" input of mux 303(5). Mux 303(1) outputs signal S3[0:1], mux 303(2) outputs signal S3[2:3], mux 303(3) outputs signal S3[4:5], mux 303(4) outputs signal S3[6:7], and mux 303(5) outputs signal S3[8:9]. Muxes 303(1)-303(5) receive signal Sel[2] from controller 350. When Sel[2] is 0, the "0" inputs of muxes 303(1)-303(5) are selected for output, and when Sel[2] is 1, the "1" inputs of muxes 303(1)-303(5) are selected for output.

Between stage 3 and stage 4, 2-bit stage-3 output signal S3[0:1] is split into 1-bit signals S3[0] and S3[1]. Similarly, 2-bit stage-3 output signal S3[2:3] is split into 1-bit signals S3[2] and S3[3], 2-bit stage-3 output signal S3[4:5] is split into 1-bit signals S3[4] and S3[5], 2-bit stage-3 output signal S3[6:7] is split into 1-bit signals S3[6] and S3[7], and 2-bit stage-3 output signal S3[8] is split into 1-bit signals S3[8] and S3[9].

In stage 4, signal S3[0] is provided to the "0" input of mux 304(1). Signal S3[1] is provided to the "1" input of mux 304(1) and the "0" input of mux 304(2). Signal S3[2] is provided to the "1" input of mux 304(2) and the "0" input of mux 304(3). Signal S3[3] is provided to the "1" input of mux 304(3) and the "0" input of mux 304(4). Signal S3[4] is provided to the "1" input of mux 304(4) and the "0" input of mux 304(5). Signal S3[5] is provided to the "1" input of mux 304(5) and the "0" input of mux 304(6). Signal S3[6] is provided to the "1" input of mux 304(6) and the "0" input of mux 304(7). Signal S3[7] is provided to the "1" input of mux 304(7) and the "0" input of mux 304(8). Signal S3[8] is provided to the "1" input of mux 304(8) and the "0" input of mux 304(9). Signal S3[9] is provided to the "1" input of mux 304(9). Mux 304(1) outputs signal S4[0], mux 304(2) outputs signal S4[1], mux 304(3) outputs signal S4[2], mux 304(4) outputs signal S4[3], mux 304(5) outputs signal S4[4], mux 304(6) outputs signal S4[5], mux 304(7) outputs signal S4[6], mux 304(8) outputs signal S4[7], and mux 304(9) outputs signal S4[8]. Muxes 304(1)-304(9) receive signal Sel[1] from controller 350.

In stage 5, signal S4[0] is provided to the "0" input of mux 305(1). Signal S4[1] is provided to the "1" input of mux 305(1) and the "0" input of mux 305(2). Signal S4[2] is provided to the "1" input of mux 305(2) and the "0" input of mux 305(3). Signal S4[3] is provided to the "1" input of mux 305(3) and the "0" input of mux 305(4). Signal S4[4] is provided to the "1" input of mux 305(4) and the "0" input of mux 305(5). Signal S4[5] is provided to the "1" input of mux 305(5) and the "0" input of mux 305(6). Signal S4[6] is provided to the "1" input of mux 305(6) and the "0" input of mux 305(7). Signal S4[7] is provided to the "1" input of mux 305(7) and the "0" input of mux 305(8). Signal S4[8] is provided to the "1" input of mux 305(8). Mux 305(1) outputs signal out[0], mux 305(2) outputs signal out[1], mux 305(3) outputs signal out[2], mux 305(4) outputs signal out[3], mux 305(5) outputs signal out[4], mux 305(6) outputs signal out [5], mux 305(7) outputs signal out[6], and mux 305(8) outputs signal out[7]. Collectively, signals out[0:7] can then be provided as candidate clock signals to an external circuit. Muxes 305(1)-305(8) receive signal Sel[0] from controller 350.

Figure 2:
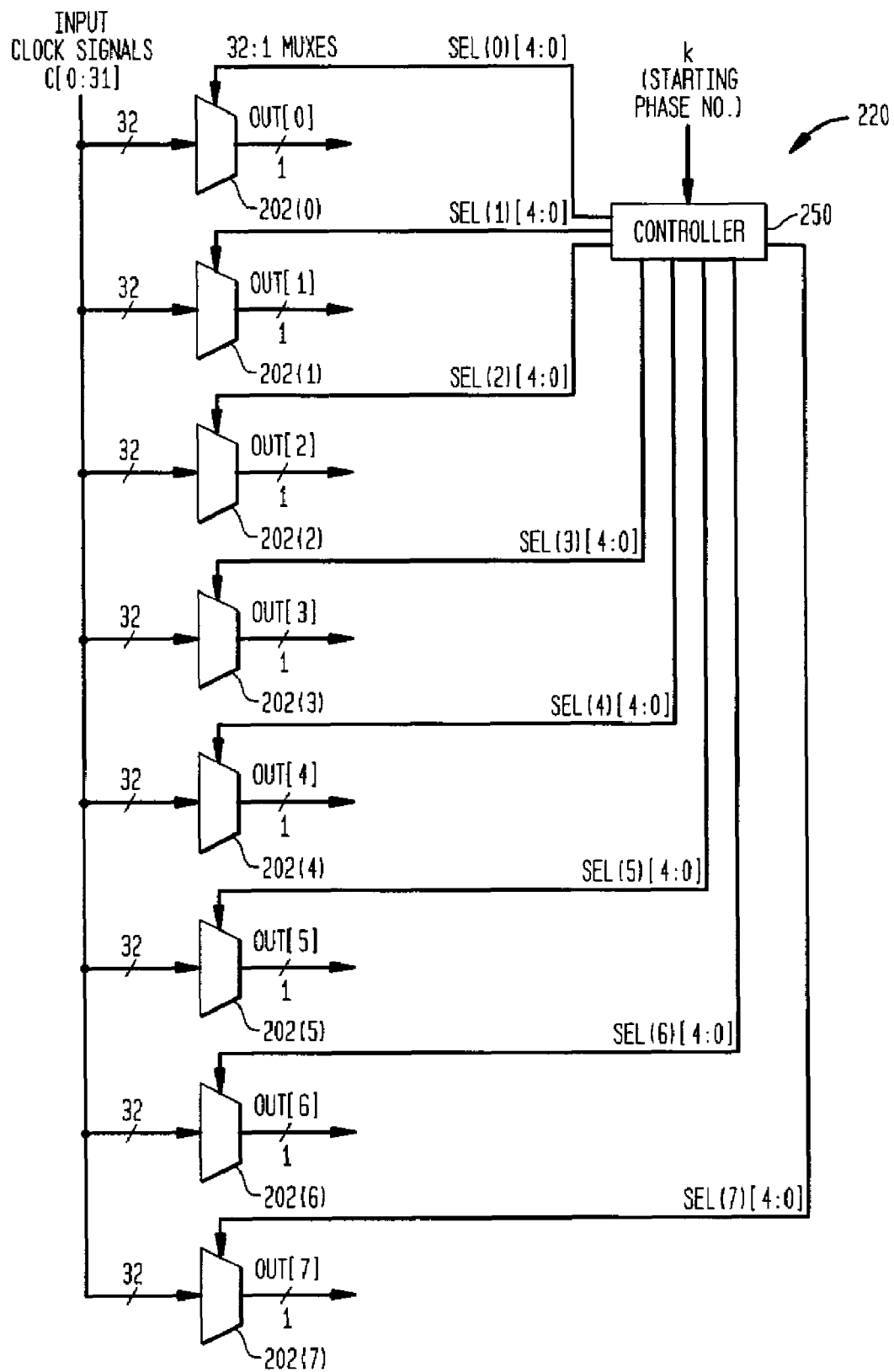
FIG. 2 is a block diagram of an exemplary prior-art phase selector for selecting and providing a set of consecutive candidate clock signals from among a plurality of input clock signals.

It can thus be seen that input clock signals C[0:31] are routed to stage-0 muxes 300(1)-300(4) such that each signal C[n] is routed to only two initial destinations (the "0" and "1" inputs of one of the stage-0 muxes 300(1)-300(4)), as opposed to a number of destinations equal to the desired number of output clock signals (e.g., 8 in FIG. 2), which is the case with the prior-art phase selector 220 of FIG. 2. At stage 1, muxes 301(1) and 301(2) reduce the number of signals even further, to half the number of input clock signals, providing an efficient routing with relatively small layout area, fanout, and power consumption. While the number of muxes continuously increases from stage 1 to stage 5, the number of individual signals being provided between muxes actually decreases at each successive stage.

FIG. 4 is a table showing the corresponding 7-bit control signal Sel[6:0] generated by controller 350 for each possible value of k.

When k is in the first quadrant, i.e., k has a value in the range of 0 to 7, output (candidate) clock signals out[0:7] will represent input clock signals corresponding to either (i) only values in the first quadrant (i.e., C[0:7]), or (ii) values in both the first and second quadrants (a set of 8 contiguous values selected from C[0:15])—but no values in the third or fourth quadrants (C[16:31]). Accordingly, when k is in the first quadrant, Sel[6] is equal to 0, causing the "0" inputs of stage-0 muxes 300(1)-300(4) to be selected, and Sel[5:4] is equal to 00, causing the "0" inputs of stage-1 muxes 301(1) and 301(2) to be selected, such that output signals S1[0:7] and S1[8:15] represent input clock signals C[0:7] and C[8:15], respectively. The remaining input clock signals C[16:31], which correspond to the third and fourth quadrants, are dropped during stages 0 and 1.

When k is in the second quadrant, i.e., k has a value in the range of 8 to 15, output (candidate) clock signals out[0:7] will represent input clock signals corresponding to either (i) only values in the second quadrant (i.e., C[8:15]), or (ii) values in both the third and second quadrants (a set of 8 contiguous values selected from C[8:23])—but no values in the first or fourth quadrants (C[0:7,24:31]). Accordingly, when k is in the second quadrant, Sel[6] is equal to 1, causing the "1" "flipped" inputs of stage-0 muxes 300(1)-300(4) to be selected, and Sel[5:4] is equal to 10, causing the "1" input of stage-1 mux 301(1) to be selected and the "0" input of stage-1 mux 301(2) to be selected, such that output signals S1[0:7] and S1[8:15] represent "flipped" input clock signals C[23:16] and C[15:8], respectively. The remaining input clock signals C[0:7, 24:31], which correspond to the first and fourth quadrants, are dropped during stages 0 and 1. It is noted that, since the "flipped" versions of input clock signals corresponding to the third and second quadrants are used, output signals out[0:7] will also be "flipped," i.e., reverse-ordered, although the reverse order should not affect most applications with which phase selector 320 is used.

When k is in the third quadrant, i.e., k has a value in the range of 16 to 23, output (candidate) clock signals out[0:7] will represent input clock signals corresponding to either (i) only values in the third quadrant (i.e., C[16:23]), or (ii) values in both the third and fourth quadrants (a set of 8 contiguous values selected from C[16:31])—but no values in the first or second quadrants (C[0:15]). Accordingly, when k is in the third quadrant, Sel[6] is equal to 0, causing the "0" inputs of stage-0 muxes 300(1)-300(4) to be selected, and Sel[5:4] is equal to 11, causing the "1" inputs of stage-1 muxes 301(1) and 301(2) to be selected, such that output signals S1[0:7] and S1[8:15] represent input clock signals C[16:23] and C[24:31], respectively. The remaining input clock signals C[0:15], which correspond to the first and second quadrants, are dropped during stages 0 and 1.

When k is in the fourth quadrant, i.e., k has a value in the range of 24 to 31, output (candidate) clock signals out[0:7] will represent input clock signals corresponding to either (i) only values in the fourth quadrant (i.e., C[24:31]), or (ii) values in both the fourth and first quadrants (a set of 8 contiguous values selected from C[24:31,0:7], recalling that C[31] and C[0] are contiguous, since the signals "wrap around," as shown in FIG. 1)—but no values in the second or third quadrants (C[8:23]). Accordingly, when k is in the fourth quadrant, Sel[6] is equal to 1, causing the "1" "flipped" inputs of stage-0 muxes 300(1)-300(4) to be selected, and Sel[5:4] is equal to 01, causing the "0" input of stage-1 mux 301(1) to be selected and the "1" input of stage-1 mux 301(2) to be selected, such that output signals S1[0:7] and S1[8:15] represent "flipped" input clock signals C[7:0] and C[31:24], respectively. The remaining input clock signals C[8:23], which correspond to the second and third quadrants, are dropped during stages 0 and 1.

FIGS. 5(*a*)-(*c*) show three tables indicating the output of each mux of phase selector 320 for three exemplary values of starting phase number k, respectively.

In the first example of FIG. 5(*a*), starting phase number k is 0, which value controller 350 uses to generate a value of 0000000 for Sel[6:0]. This value causes controller 350 to control the selections of all of the muxes concurrently, as follows. Controller 350 selects the "0" inputs of stage-0 muxes 300(1)-300(4), which output clock signals C[0:7] as S0[0:7], C[16:23] as S0[16:23], C[8:15] as S0[8:15], and C[24:31] as S0[24:31], respectively. Controller 350 selects the "0" input of stage-1 mux 301(1), which outputs clock signal C[0:7] as S1[0:7]. Controller 350 selects the "0" input of stage-1 mux 301(2), which outputs clock signal C[8:15] as S1[8:15]. Controller 350 selects the "0" inputs of stage-2 muxes 302(1)-302(3), which output clock signals C[0:3] as S2[0:3], C[4:7] as S2[4:7], and C[8:11] as S2[8:11], respectively. Controller 350 selects the "0" inputs of stage-3 muxes 303(1)-303(5), which output clock signals C[0:1] as S3[0:1], C[2:3] as S3[2:3], C[4:5] as S3[4:5], C[6:7] as S3[6:7], and C[8:9] as S3[8:9], respectively. Controller 350 selects the "0" inputs of stage-4 muxes 304(1)-304(9), which output clock signals C[0] as S4[0], C[1] as S4[1], C[2] as S4[2], C[3] as S4[3], C[4] as S4[4], C[5] as S4[5], C[6] as S4[6], C[7] as S4[7], and C[8] as S4[8], respectively. Controller 350 selects the "0" inputs of stage-5 muxes 305(1)-305(8), which output clock signals C[0] as out[0], C[1] as out[1], C[2] as out[2], C[3] as out[3], C[4] as out[4], C[5] as out[5], C[6] as out[6], and C[7] as out[7].

In the second example of FIG. 5(*b*), starting phase number k is 9, which value controller 350 uses to generate a value of 1101101 for Sel[6:0]. This value causes controller 350 to control the selections of all of the muxes concurrently, as follows. Controller 350 selects the "1" "flipped" inputs of stage-0 muxes 300(1)-300(4), which output clock signals C[7:0] as S0[0:7], C[23:16] as S0[16:23], C[15:8] as S0[8:15], and C[31:24] as S0[24:31], respectively. Controller 350 selects the "1" input of stage-1 mux 301(1), which outputs clock signal C[23:16] as S1[0:7]. Controller 350 selects the "0" input of stage-1 mux 301(2), which outputs clock signal C[15:8] as S1[8:15]. Controller 350 selects the "1" inputs of stage-2 muxes 302(1)-302(3), which output clock signals C[19:16] as S2[0:3], C[15:12] as S2[4:7], and C[11:8] as S2[8:11], respectively. Controller 350 selects the "1" inputs of stage-3 muxes 303(1)-303(5), which output clock signals C[17:16] as S3[0:1], C[15:14] as S3[2:3], C[13:12] as S3[4:5], C[11:10] as S3[6:7], and C[9:8] as S3[8:9], respectively. Controller 350 selects the "0" inputs of stage-4 muxes 304(1)-304(9), which output clock signals C[17] as S4[0], C[16] as S4[1], C[15] as S4[2], C[14] as S4[3], C[13] as S4[4], C[12] as S4[5], C[11] as S4[6], C[10] as S4[7], and C[9] as S4[8], respectively. Controller 350 selects the "1" inputs of stage-5 muxes 305(1)-305(8), which output clock signals C[16] as out[0], C[15] as out[1], C[14] as out[2], C[13] as out[3], C[12] as out[4], C[11] as out[5], C[10] as out[6], and C[9] as out[7].

In the third example of FIG. 5(*c*), starting phase number k is 26, which value controller 350 uses to generate a value of 1011011 for Sel[6:0]. This value causes controller 350 to control the selections of all of the muxes concurrently, as follows. Controller 350 selects the "1" "flipped" inputs of stage-0 muxes 300(1)-300(4), which output clock signals C[7:0] as S0[0:7], C[23:16] as S0[16:23], C[15:8] as S0[8:15], and C[31:24] as S0[24:31], respectively. Controller 350 selects the "0" input of stage-1 mux 301(1), which outputs clock signal C[7:0] as S1[0:7]. Controller 350 selects the "1" input of stage-1 mux 301(2), which outputs clock signal C[31:24] as S1[8:15]. Controller 350 selects the "1" inputs of stage-2 muxes 302(1)-302(3), which output clock signals C[3:0] as S2[0:3], C[31:28] as S2[4:7], and C[27:24] as S2[8:11], respectively. Controller 350 selects the "0" inputs of stage-3 muxes 303(1)-303(5), which output clock signals C[3:2] as S3[0:1], C[1:0] as S3[2:3], C[31:30] as S3[4:5], C[29:28] as S3[6:7], and C[27:26] as S3[8:9], respectively. Controller 350 selects the "1" inputs of stage-4 muxes 304(1)-304(9), which output clock signals C[2] as S4[0], C[1] as S4[1], C[0] as S4[2], C[31] as S4[3], C[30] as S4[4], C[29] as S4[5], C[28] as S4[6], C[27] as S4[7], and C[26] as S4[8], respectively. Controller 350 selects the "1" inputs of stage-5 muxes 305(1)-305(8), which output clock signals C[1] as out[0], C[0] as out[1], C[31] as out[2], C[30] as out[3], C[29] as out[4], C[28] as out[5], C[27] as out[6], and C[26] as out[7].

Thus, it can be seen that each of stages 2-5 drops either the first or the last set of one or more clock signals received from the previous stage.

With reference now to FIG. 6, a flowchart 600 illustrates an exemplary algorithm implemented in controller 350 for controlling the muxes of phase selector 320, including deriving and generating the control signal Sel[6:0] that corresponds to a given value of k (as shown in the table of FIG. 4). The algorithm begins at block 601, wherein starting phase number k[4:0] is received.

At block 602, a determination is made whether k[3] is 0 or 1. If k[3] is 0, then the algorithm proceeds to block 603, and if k[3] is 1, then the algorithm proceeds to block 606. At block 603, a determination is made whether k[4] is 0 or 1. If k[4] is 0, then the algorithm proceeds to block 604, and if k[4] is 1, then the algorithm proceeds to block 605. At block 604, Sel[6:0] is derived by stripping and replacing the two bits k[4:3] with three bits having values of 000 and appending a bit having a value of 0 after k[0]. At block 605, Sel[6:0] is derived by stripping and replacing the two bits k[4:3] with three bits having values of 011 and appending a bit having a value of 0 after k[0]. Following the execution of blocks 604 and 605, the algorithm proceeds to block 610.

At block 606, a determination is made whether k[4] is 0 or 1. If k[4] is 0, then the algorithm proceeds to block 607, and if k[4] is 1, then the algorithm proceeds to block 608. At block 607, Sel[6:0] is derived by stripping and replacing the two bits k[4:3] with three bits having values of 010 and appending a bit having a value of 0 after k[0]. At block 608, Sel[6:0] is derived by stripping and replacing the two bits k[4:3] with three bits having values of 101 and appending a bit having a value of 0 after k[0]. Following the execution of blocks 607 and 608, the algorithm proceeds to block 609.

At block 609, each of the four bits of Sel[3:0] is inverted, to invert the selections of the muxes of stages 2-5, so as to account for "flipped" values being used when k is in the second or fourth quadrants.

At block 610, control signal Sel[6] is sent to stage-0 muxes 300(1)-300(4), control signal Sel[5] is sent to stage-1 mux 301(1), control signal Sel[4] is sent to stage-1 mux 301(2), control signal Sel[3] is sent to stage-2 muxes 302(1)-302(3), control signal Sel[2] is sent to stage-3 muxes 303(1)-303(5), control signal Sel[1] is sent to stage-4 muxes 304(1)-304(9), and control signal Sel[0] is sent to stage-5 muxes 305(1)-305(8).

Following block 610, depending on the application with which phase selector 320 is being used, the algorithm may or may not return to block 601 to select a different set of consecutive candidate clock signals from the set of input clock signals C[0:31], based on a different value of starting phase number k.

Phase selector 320 may be generalized for other numbers of input and output clock signals, where the number of output signals is less than or equal to one plus one-fourth the number of input signals, as follows. The muxes are arranged in M stages (numbered 0 through M−1), wherein M>2, and various numbers of stages are possible in various embodiments. The last stage, stage M−1, contains a number of muxes equal to the number of consecutive phases being selected, beginning with starting phase k. Various numbers of stages can be used to handle various numbers of output clock signals selected from various numbers of input clock signals. For example, if selecting 16 signals out of 64, M could be equal to 7, and the 7 stages could be arranged as follows: (0) flip stage; (1) selecting 32 out of 64 signals; (2) selecting 24 out of 32 signals; (3) selecting 20 out of 24 signals; (4) selecting 18 out of 20 signals; (5) selecting 17 out of 18 signals; and (6) selecting 16 out of 17 signals. In other embodiments, the greater the number of input signals or the smaller the number of output signals there are, the greater number of signals could be dropped at each stage.

Stage 0, which is the "flip" stage, receives the plurality of input clock signals, and stage-1 muxes receive the stage-0 output clock signals. Stage 0 comprises four 2:1 muxes, each receiving one-quarter of the input signals corresponding to a different quadrant. Each stage-0 mux receives the quadrant of input clock signals in forward order at one input and the same quadrant of input clock signals in reverse order at the other input, and each of the stage-0 muxes is controlled by a control signal Sel[M].

Stage 1 comprises 2 muxes. The first stage-1 mux receives, at one input, the clock signals output from the stage-0 mux receiving the first quadrant, and at the other input, the clock signals output from the stage-0 mux receiving the third quadrant. The second stage-1 mux receives, at one input, the clock signals output from the stage-0 mux receiving the second quadrant, and at the other input, the clock signals output from the stage-0 mux receiving the fourth quadrant. The remaining muxes are arranged in stages 2 through M−1. Additional muxes can be added to stage 1 to handle embodiments in which the number of output signals can span more than two adjacent quadrants (e.g., selecting 16 clock signals out of 32).

For all stages m, where $1 \leq m \leq M-1$, each stage-m mux (i) receives a number $n_m$ of clock signals from the previous stage and (ii) outputs a number $n_m/2$ of stage-m output clock signals.

The first stage-1 mux receives control signal Sel[M−1], and the second stage-1 mux receives control signal Sel[M−2]. For the remaining stages, i.e., where $2 \leq m \leq -1$, each stage-m mux is controlled by a control signal Sel[M−1−m]. Control signals Sel[M:0] are generated by (i) stripping, beginning with bit k[M], two consecutive bits of an (M−1)-bit binary representation k[M−2:0] of starting phase number k, (ii) replacing the two stripped bits with three bits having values of 000 when k[M−2:M−3]=00, values of 011 when k[M−2:M−3]=10, values of 010 when k[M−2:M−3]=01, and values of 101 when k[M2:M−3]=11; (iii) appending a bit having value 0 after k[0]; and (iv) inverting each bit of Sel[M−3:0] when Sel[M:M−2]=010 or 101. Control signal Sel[M−3] is provided to the stage-2 muxes, control signal Sel[M−4] is provided to the stage-3 muxes, and so forth, with control signal Sel[0] being provided to stage M−1. The stage-(M−1) output signals are the desired set of candidate clock signals.

Figure 7:
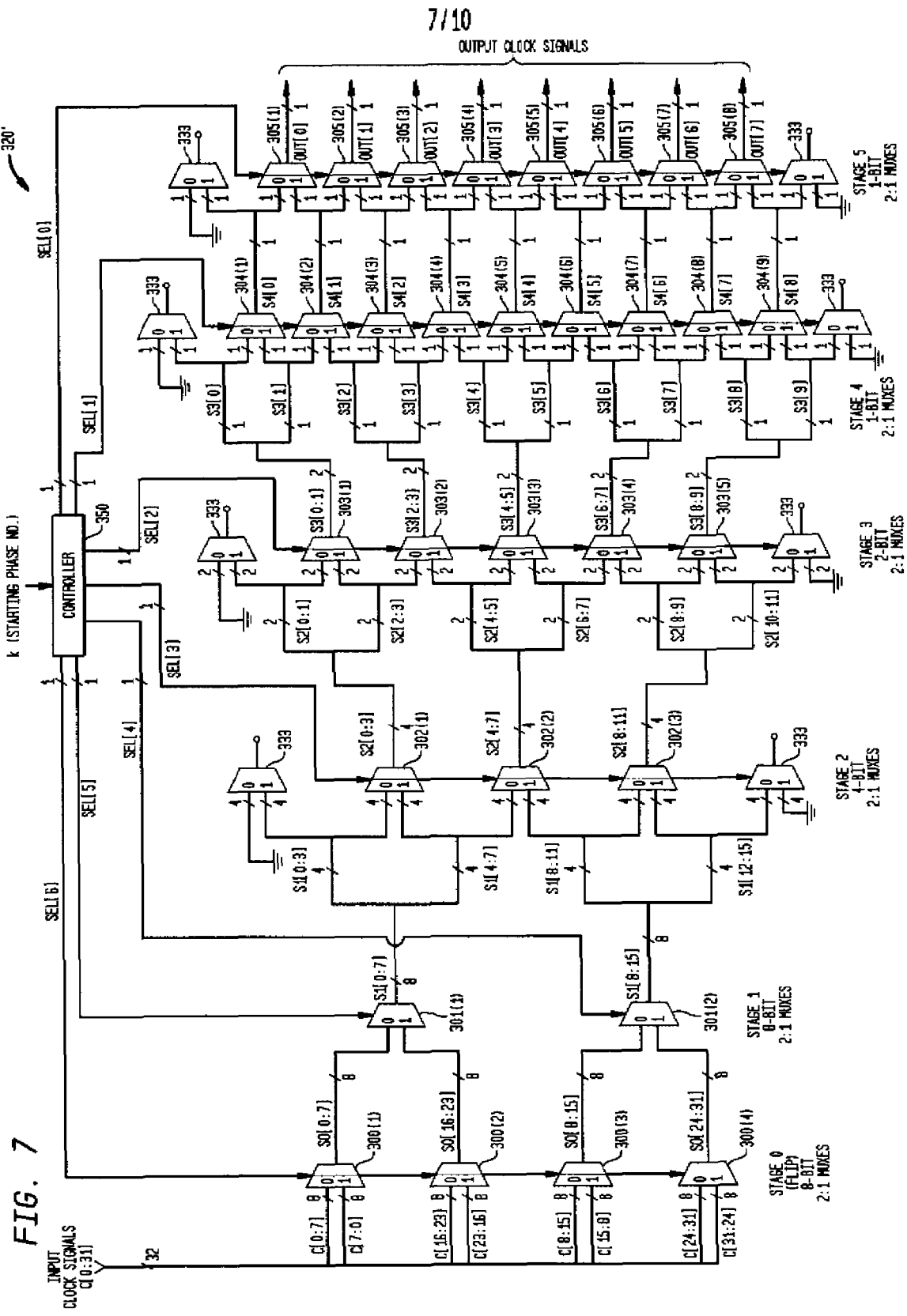
FIG. 7 is a block diagram of the phase selector of FIG. 3 with dummy muxes added to provide load balancing.

Turning now to FIG. 7, a phase selector 320' according to an alternative embodiment is illustrated. The difference between phase selectors 320 and 320' is that phase selector 320' includes dummy muxes 333, i.e., an additional mux is added to the top and bottom of each of stages 2-5. Each of dummy muxes 333 has (1) one input connected to ground, (2) the other input connected to a signal from the previous stage that was provided to only a single mux in phase selector 320, and (3) a "floating" output not connected to any other component. Dummy muxes 333 are provided for load balancing (i.e., so that each signal or set of signals that is provided to an input of one mux is also provided to an input of another mux), and although shown in FIG. 7 as not receiving any control signals from controller 350, in other embodiments, each pair of dummy muxes 333 may receive the same control signals as the other muxes of the corresponding stage.

While the foregoing examples employ input clock signals C[0:31] that are evenly distributed over 360 degrees and "wrap around" (e.g., as shown in FIG. 1), it should be understood that a similar structure for phase selectors 320 (and 320') and a similar algorithm to that shown in FIG. 6 could be used to select consecutive candidate clock signals from other sets of input clock signals. For example, if the input clock signals do not "wrap around," then stage 0 and its corresponding control signals could be eliminated, since no "flipping" of input clock signals or division of the input clock signals into quadrants would take place.

Figure 8:
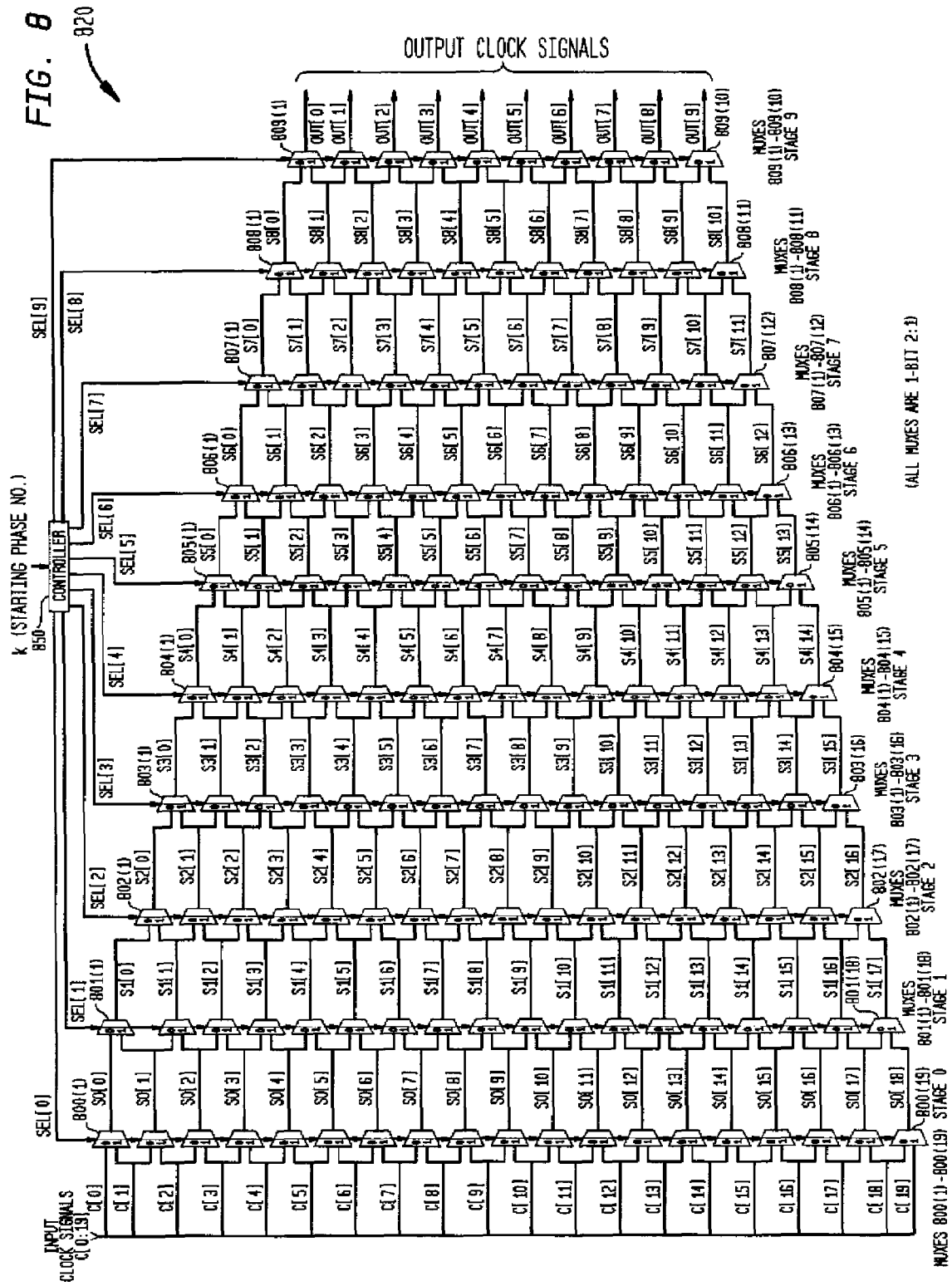
FIG. 8 is a block diagram of an exemplary phase selector consistent with a second embodiment of the present invention.

With reference now to FIG. 8, an exemplary phase selector 820 consistent with yet another embodiment of the present invention is illustrated. In this example, phase selector 820 is arranged to select 10 consecutive clock signals from a set of 20 input clock signals, and the signals do not "wrap around" (the input clock signals might be, e.g., C[0] through C[19] of FIG. 1). An external circuit provides starting phase number k to specify that the desired 10 consecutive input clock signals are C[k] through C[k+9], where $0 \leq k \leq 10$.

As shown, phase selector 820 comprises a controller 850 and a plurality of muxes (800(1)-800(19), 801(1)-801(18), 802(1)-802(17), 803(1)-803(16), 804(1)-804(15), 805(1)-805(14), 806(1)-806(13), 807(1)-807(12), 808(1)-808(11), and 809(1)-809(10)) arranged as 10 different stages, numbered 0 to 9. All of the muxes in phase selector 820 are 1-bit 2:1 muxes. Stage 0 comprises muxes 800(1)-800(19), stage 1 comprises muxes 801(1)-801(18), stage 2 comprises muxes 802(1)-802(17), stage 3 comprises muxes 803(1)-803(16), stage 4 comprises muxes 804(1)-804(15), stage 5 comprises muxes 805(1)-805(14), stage 6 comprises muxes 806(1)-806(13), stage 7 comprises muxes 807(1)-807(12), stage 8 comprises muxes 808(1)-808(11), and stage 9 comprises muxes 809(1)-809(10). Within each stage, the muxes are desirably arranged linearly and adjacent to one another, as shown in FIG. 8, such that the connections between the various muxes have short physical routing, so as to reduce power consumption of phase selector 820. Controller 850 implements an algorithm that uses starting phase number k to generate corresponding control signals Sel[0:9] for controlling stage-0 muxes 800(1)-800(19), stage-1 muxes 801(1)-801(18), stage-2 muxes 802(1)-802(17), stage-3 muxes 803(1)-803(16), stage-4 muxes 804(1)-804(15), stage-5 muxes 805(1)-805(14), stage-6 muxes 806(1)-806(13), stage-7 muxes 807(1)-807(12), stage-8 muxes 808(1)-808(11), and stage-9 muxes 809(1)-809(10), respectively.

In stage 0, the plurality of received input clock signals C[0:19] are provided to stage-0 muxes 800(1)-800(19), as follows. Input clock signal C[0] is provided to the "0" input of stage-0 mux 800(1). For all 1≦n≦18, input clock signals C[n] are sent to the "1" inputs of stage-0 muxes 800(n) and to the "0" inputs of stage-0 muxes 800(n+1). Input clock signal C[19] is provided to the "1" input of stage-0 mux 800(19). For all 1≦n≦19, each mux 800(n) outputs signal S0[n−1].

In stage 1, stage-0 output signals S0[0:18] are provided to stage-1 muxes 801(1)-801(18), as follows. Signal S0[0] is provided to the "0" input of stage-1 mux 801(1). For all 1≦n≦17, signals S0[n] are sent to the "1" inputs of stage-1 muxes 801(n) and to the "0" inputs of stage-1 muxes 801(n+1). Signal S0[18] is provided to the "1" input of stage-0 mux 801(18). For all 0<n<18, each mux 801(n) outputs signal S1[n−1].

As shown in FIG. 8, stages 2-8 are arranged in like manner as stage 1, with each successive stage having one fewer mux than the previous stage, such that one input clock signal, i.e., either the clock signal at the top or bottom of the stage gets dropped at each successive stage.

In stage 9, stage-8 output signals S8[0:10] are provided to stage-8 muxes 809(1)-809(10), as follows. Signal S8[0] is provided to the "0" input of mux 809(1). For all 1≦n≦9, signals S8[n] are sent to the "1" inputs of stage-9 muxes 809(n) and to the "0" inputs of stage-9 muxes 809(n+1). Signal S8[10] is provided to the "1" input of mux 809(10). For all 1≦n≦10, each mux 809(n) outputs signal out[n−1].

In an alternative embodiment, dummy muxes are provided at the top and bottom of each stage for load balancing, in like manner to dummy muxes 333 illustrated in FIG. 7.

FIG. 9 is a table showing the corresponding 10-bit control signal Sel[0:9] generated by controller 850 for each possible value of k.

Figures 10A, 10B:
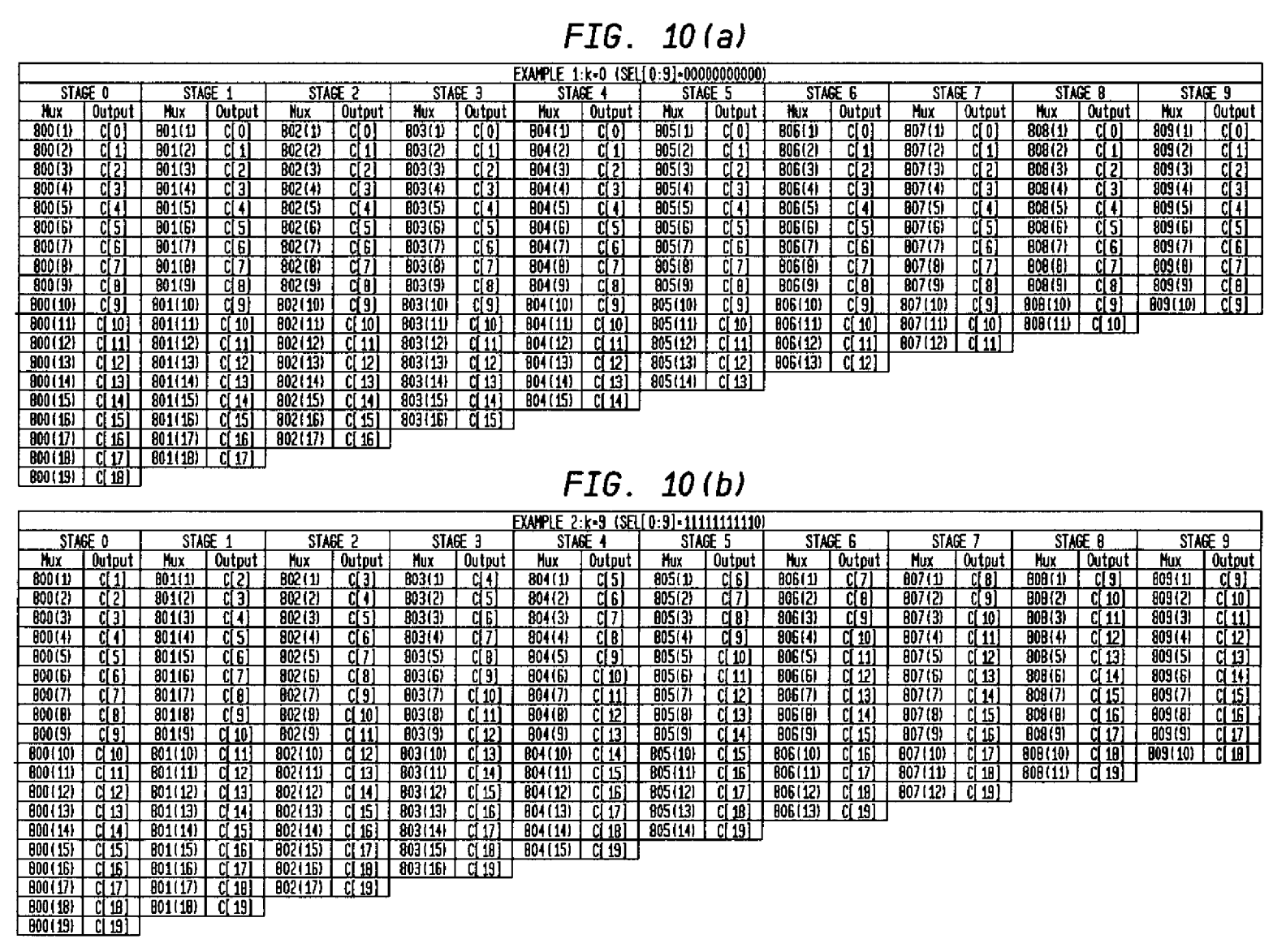

FIGS. 10(a)-(b) show two tables indicating the output of each mux of phase selector 820 for two exemplary values of starting phase number k, respectively.

In the first example of FIG. P(a), starting phase number k is 0, which value controller 850 uses to generate a value of 0000000000 for Sel[0:9]. This value causes controller 850 to control the selections of all of the muxes concurrently, as follows. Controller 850 selects the "0" inputs of stage-0 muxes 800(1)-800(19), which output clock signals C[0] (as S0[0]) through C[18] (as S[18]), respectively. Controller 850 selects the "0" inputs of stage-1 muxes 801(1)-801(18), which output clock signals C[0] (as S1[0]) through C[17] (as S1[17]), respectively. Controller 850 selects the "0" inputs of stage-2 muxes 802(1)-802(17), which output clock signals C[0] (as S2[0]) through C[16] (as S2[16]), respectively. Controller 850 selects the "0" inputs of stage-3 muxes 803(1)-803(16), which output clock signals C[0] (as S3[0]) through C[15] (as S3[15]), respectively. Controller 850 selects the "0" inputs of stage-4 muxes 804(1)-804(15), which output clock signals C[0] (as S4[0]) through C[14] (as S4[14]), respectively. Controller 850 selects the "0" inputs of stage-5 muxes 805(1)-805(14), which output clock signals C[0] (as S5[0]) through C[13] (as S5[13]), respectively. Controller 850 selects the "0" inputs of stage-6 muxes 806(1)-806(13), which output clock signals C[0] (as S6[0]) through C[12] (as S6[12]), respectively. Controller 850 selects the "0" inputs of stage-7 muxes 807(1)-807(12), which output clock signals C[0] (as S7[0]) through C[11] (as S7[11]), respectively. Controller 850 selects the "0" inputs of stage-8 muxes 808(1)-808(11), which output clock signals C[0] (as S8[0]) through C[10] (as S8[10]), respectively. Controller 850 selects the "0" inputs of stage-9 muxes 809(1)-809(10), which output clock signals C[0] (as out[0]) through C[10] (as out[9]), respectively.

In the second example of FIG. 10(b), starting phase number k is 9, which value controller 850 uses to generate a value of 1111111110 for Sel[0:9]. This value causes controller 850 to control the selections of all of the muxes concurrently, as follows. Controller 850 selects the "1" inputs of stage-0 muxes 800(1)-800(19), which output clock signals C[1] (as S0[0]) through C[19] (as S[18]), respectively. Controller 850 selects the "1" inputs of stage-1 muxes 801(1)-801(18), which output clock signals C[2] (as S1[0]) through C[19] (as S1[17]), respectively. Controller 850 selects the "1" inputs of stage-2 muxes 802(1)-802(17), which output clock signals C[3] (as S2[0]) through C[19] (as S2[16]), respectively. Controller 850 selects the "1" inputs of stage-3 muxes 803(1)-803(16), which output clock signals C[4] (as S3[0]) through C[19] (as S3[15]), respectively. Controller 850 selects the "1" inputs of stage-4 muxes 804(1)-804(15), which output clock signals C[5] (as S4[0]) through C[19] (as S4[14]), respectively. Controller 850 selects the "1" inputs of stage-5 muxes 805(1)-805(14), which output clock signals C[6] (as S5[0]) through C[19] (as S5[13]), respectively. Controller 850 selects the "1" inputs of stage-6 muxes 806(1)-806(13), which output clock signals C[7] (as S6[0]) through C[19] (as S6[12]), respectively. Controller 850 selects the "1" inputs of stage-7 muxes 807(1)-807(12), which output clock signals C[8] (as S7[0]) through C[19] (as S7[ 11]), respectively. Controller 850 selects the "1" inputs of stage-8 muxes 808(1)-808(11), which output clock signals C[9] (as S8[0]) through C[19] (as S8[10]), respectively. Controller 850 selects the "0" inputs of stage-9 muxes 809(1)-809(10), which output clock signals C[9] (as out[0]) through C[18] (as out[9]), respectively.

The mux control signals for the remaining values of k, as shown in the table of FIG. 9, are generated in like manner. Thus, it can be seen that each of the stages drops either the first or the last clock signal received from the previous stage.

With reference now to FIG. 11, a flowchart 1100 illustrates an exemplary algorithm implemented in controller 850 for controlling the muxes of phase selector 820, including deriving and generating the 10-bit control signal Sel[0:9] that corresponds to a given value of k (as shown in the table of FIG. 9). The algorithm begins at block 1101, wherein starting phase number k is received. At block 1102, Sel[0:9] is derived by setting k bits to a value of 1, beginning at Sel[9], and the remaining bits of Sel[0:9] are set to a value of 0. At block 1103, control signal Sel[m] is sent to all muxes of stage m, for each stage 0≦m≦9, i.e., control signal Sel[0] is sent to stage-0 muxes 800(1)-800(19), control signal Sel[1] is sent to stage-1 muxes 801(1)-801(18), and so forth. Following block 1103, depending on the application with which phase selector 820 is being used, the algorithm may or may not return to block 1101 to select a different set of consecutive candidate clock signals from the set of input clock signals C[0:19], based on a different value of starting phase number k.

It can thus be seen that input clock signals C[0:19] are routed to stage-0 muxes 800(1)-800(14) such that each signal C[n] is routed to only one or two initial destinations, as opposed to a number of destinations equal to the desired number of output clock signals (e.g., 8 in FIG. 2), which is the case with the prior-art phase selector 220 of FIG. 2. Since each successive stage employs one fewer mux and one fewer clock signal than the previous stage, an efficient routing with reduced layout area, fanout, and power consumption is provided.

While the foregoing example employs input clock signals C[0:19] that do not "wrap around," it should be understood that a similar structure for phase selector 820 and a similar algorithm to that shown in FIG. 11 could be used to select other numbers of consecutive candidate clock signals from other sets of input clock signals. For example, if the input clock signals are evenly distributed over 360 degrees and "wrap around," as is the case with input clock signals C[0:31] shown in FIG. 1, then an additional "flip" stage and its corresponding control signals could be added prior to stage 0, to handle the "flipping" of input clock signals. This "flip" stage could be structured and controlled in a similar manner to stage 0 of phase selector 320 in FIG. 3 and may include an additional stage corresponding to stage 1 of phase selector 320.

Phase selector 820 may be generalized for other numbers of input clock signals x and output clock signals y, e.g., as follows. The 1-bit 2:1 muxes are arranged in M stages, where M=x-y. The first stage, stage 0, contains (x-1) muxes. At each successive stage, the number of muxes is reduced by one until the last stage, stage M-1, which contains y muxes. Each stage receives n clock signals and provides (n-1) clock signals as output. Each of the stage-m muxes is controlled by a control signal Sel[m]. The M-bit control signal Sel[0:M-1] is generated by setting the first k bits, beginning with Sel[M-1], to a value of 1 and setting the remaining bits of Sel[0:M-1] to a value of 0. The stage-(M-1) output signals are the desired set of candidate clock signals.

It should be understood that phase selectors 320, 320', and 820 are merely exemplary, and that phase selectors consistent with the present invention may have other numbers of input clock signals, stages, numbers of muxes per stage, and output signals. Controllers 350 and 850 and the algorithms of FIGS. 6 and 11 are also exemplary, and other control means and/or control logic may be provided in alternative embodiments consistent with the present invention.

While a selected set from among a plurality of input clock signals is referred to herein as a set of "candidate" clock signals, this term should be interpreted broadly and not limited to CDR applications. A phase selector consistent with the present invention may be used for applications employing phase selection wherein the selected set from among the plurality of input clock signals is used for purposes other than serving as a set of "candidate" clock signals, e.g., in current testing or measuring applications.

Although the embodiments described herein are described as employing multiplexers to effect the selection of clock signals, the term "multiplexers," as used herein, should be understood to include other types of selectors or switching devices, as well.

Thus, it can be seen that, even when selecting a large number of candidate clock signals from among a large number of input clock signals, phase selectors consistent with the present invention can exploit the physical positioning of input clock signal wiring, muxes, and wiring between mux stages, resulting in reduced wiring length, as well as reduced logic and a reduced number of control bits needed to control all of the muxes.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the present invention has been described in the context of a clock selector that selects a set of candidate clock signals having consecutive phase offsets from among a plurality of input clock signals having consecutive phase outputs, the invention is not so limited. For example, the phase offsets do not have to be consecutive, and the input clock signals may embody variations in clock signals other than phase, e.g., different frequencies or amplitudes. Hence, although referred to herein as a "phase selector," the invention may be used, in a more general sense, as a "clock selector."

I claim:

1. A clock selector for selecting a set of candidate clock signals from among a plurality of input clock signals, the clock selector comprising:
   control logic adapted to generate a plurality of control signals; and
   a plurality of muxes controlled by the control signals and arranged in two or more stages comprising at least a first stage and a last stage, each stage receiving an input and providing an output;
   wherein:
   the input to the first stage is the plurality of input clock signals;
   at least one stage is adapted to (i) receive a plurality of clock signals, (ii) drop at least the first or the last clock signal of the received plurality of clock signals, and (iii) output a reduced plurality of clock signals;

the output of the last stage is the set of candidate clock signals; and each input clock signal is routed to only two first-stage mux inputs.

2. The invention of claim 1, wherein the two first-stage mux inputs correspond to the same mux.

3. The invention of claim 1, wherein the two first-stage mux inputs correspond to different muxes.

4. The invention of claim 1, wherein the first stage comprises 4 muxes, each first-stage mux receiving, in forward order at one input and in reverse order at the other input, a different quadrant comprising one-fourth of the input clock signals.

5. The invention of claim 4, further comprising a second stage comprising 2 muxes, the first second-stage mux receiving outputs from the two first-stage muxes corresponding to the first and third quadrants, and the second second-stage mux receiving outputs from the two first-stage muxes corresponding to the second and fourth quadrants.

6. The invention of claim 1, wherein each clock signal in the set of candidate clock signals is output by a different mux in the last stage.

7. The invention of claim 1, wherein each mux is a 2:1 mux.

8. The invention of claim 1, wherein, for at least one stage, all of the muxes in the at least one stage are controlled by the same control signal.

9. The invention of claim 8, wherein, for at least one other stage (e.g., stage 1), each mux in the at least one other stage is controlled by a different control signal.

10. The invention of claim 8, wherein, for each stage, all of the muxes in said each stage are controlled by the same control signal.

11. The invention of claim 1, wherein the control signals are generated based on a received starting phase number k representing the $k^{th}$ input clock signal.

12. The invention of claim 1, further comprising at least one dummy mux added at least one end of at least one of the stages of muxes.

13. The invention of claim 1, wherein the clock signals in the set of candidate clock signals are consecutive.

14. The invention of claim 1, wherein consecutive input clock signals are uniformly time-shifted relative to one another.

15. The invention of claim 1, wherein the input clock signals are evenly distributed over 360 degrees.

16. A method of selecting a set of candidate clock signals from among a plurality of input clock signals, the method comprising:

generating a plurality of control signals; and controlling a plurality of muxes using the control signals; wherein:

the muxes are arranged in two or more stages comprising at least a first stage and a last stage, each stage receiving an input and providing an output;

the input to the first stage is the plurality of input clock signals;

at least one stage is adapted to (i) receive a plurality of clock signals, (ii) drop at least the first or the last clock signal of the received plurality of clock signals, and (iii) output a reduced plurality of clock signals; and the output of the last stage is the set of candidate clock signals;

and further comprising:

routing each input clock signal to only two first-stage mux inputs.

17. The invention of claim 16, further comprising, for at least one stage, controlling all of the muxes in the at least one stage by the same control signal.

18. The invention of claim 16, further comprising generating the control signals based on a received starting phase number k representing the $k^{th}$ input clock signal.

19. A clock selector for selecting a set of candidate clock signals from among a plurality of input clock signals, the clock selector comprising:

control logic adapted to generate a plurality of control signals; and a plurality of muxes controlled by the control signals and arranged in two or more stages comprising at least a first stage and a last stage, each stage receiving an input and providing an output;

wherein:

the input to the first stage is the plurality of input clock signals;

at least one stage is adapted to (i) receive a plurality of clock signals, (ii) drop at least the first or the last clock signal of the received plurality of clock signals, and (iii) output a reduced plurality of clock signals;

the output of the last stage is the set of candidate clock signals; and the first stage comprises 4 muxes, each first-stage mux receiving, in forward order at one input and in reverse order at the other input, a different quadrant comprising one-fourth of the input clock signals.

20. The invention of claim 19, wherein:

each input clock signal is routed to only two first-stage mux inputs; and the two first-stage mux inputs correspond to the same mux.

21. The invention of claim 19, wherein:

each input clock signal is routed to only two first-stage mux inputs; and the two first-stage mux inputs correspond to different muxes.

22. The invention of claim 19, further comprising a second stage comprising 2 muxes, the first second-stage mux receiving outputs from the two first-stage muxes corresponding to the first and third quadrants, and the second second-stage mux receiving outputs from the two first-stage muxes corresponding to the second and fourth quadrants.

23. The invention of claim 19, wherein each mux is a 2:1 mux.

24. The invention of claim 23, further comprising a second stage comprising 2 muxes, the first second-stage mux receiving outputs from the two first-stage muxes corresponding to the first and third quadrants, and the second second-stage mux receiving outputs from the two first-stage muxes corresponding to the second and fourth quadrants.

25. The invention of claim 19, wherein the control signals are generated based on a received starting phase number k representing the $k^{th}$ input clock signal.

26. The invention of claim 19, further comprising at least one dummy mux added at least one end of at least one of the stages of muxes.

27. The invention of claim 19, wherein the clock signals in the set of candidate clock signals are consecutive.

28. A clock selector for selecting a set of candidate clock signals from among a plurality of input clock signals, the clock selector comprising:

control logic adapted to generate a plurality of control signals; and a plurality of muxes controlled by the control signals and arranged in two or more stages comprising at least a first stage and a last stage, each stage receiving an input and providing an output;

wherein:

the input to the first stage is the plurality of input clock signals;

at least one stage is adapted to (i) receive a plurality of clock signals, (ii) drop at least the first or the last clock signal of the received plurality of clock signals, and (iii) output a reduced plurality of clock signals;

the output of the last stage is the set of candidate clock signals; and each mux is a 2:1 mux.

29. The invention of claim 28, wherein:
each input clock signal is routed to only two first-stage mux inputs; and
the two first-stage mux inputs correspond to the same mux.

30. The invention of claim 28, wherein:
each input clock signal is routed to only two first-stage mux inputs; and
the two first-stage mux inputs correspond to different muxes.

31. The invention of claim 28, wherein the control signals are generated based on a received starting phase number k representing the $k^{th}$ input clock signal.

32. The invention of claim 28, further comprising at least one dummy mux added at least one end of at least one of the stages of muxes.

33. The invention of claim 28, wherein the clock signals in the set of candidate clock signals are consecutive.

34. A clock selector for selecting a set of candidate clock signals from among a plurality of input clock signals, the clock selector comprising:

control logic adapted to generate a plurality of control signals; and a plurality of muxes controlled by the control signals and arranged in two or more stages comprising at least a first stage and a last stage, each stage receiving an input and providing an output;

wherein:

the input to the first stage is the plurality of input clock signals;

at least one stage is adapted to (i) receive a plurality of clock signals, (ii) drop at least the first or the last clock signal of the received plurality of clock signals, and (iii) output a reduced plurality of clock signals;

the output of the last stage is the set of candidate clock signals; and the control signals are generated based on a received starting phase number k representing the $k^{th}$ input clock signal.

35. The invention of claim 34, wherein:
each input clock signal is routed to only two first-stage mux inputs; and
the two first-stage mux inputs correspond to the same mux.

36. The invention of claim 34, wherein:
each input clock signal is routed to only two first-stage mux inputs; and
the two first-stage mux inputs correspond to different muxes.

37. The invention of claim 34, wherein the first stage comprises 4 muxes, each first-stage mux receiving, in forward order at one input and in reverse order at the other input, a different quadrant comprising one-fourth of the input clock signals;

and further comprising:

a second stage comprising 2 muxes, the first second-stage mux receiving outputs from the two first-stage muxes corresponding to the first and third quadrants, and the second second-stage mux receiving outputs from the two first-stage muxes corresponding to the second and fourth quadrants.

38. The invention of claim 34, further comprising at least one dummy mux added at least one end of at least one of the stages of muxes.

39. The invention of claim 34, wherein the clock signals in the set of candidate clock signals are consecutive.

40. A clock selector for selecting a set of candidate clock signals from among a plurality of input clock signals, the clock selector comprising:

control logic adapted to generate a plurality of control signals;

a plurality of muxes controlled by the control signals and arranged in two or more stages comprising at least a first stage and a last stage, each stage receiving an input and providing an output; and at least one dummy mux added at least one end of at least one of the stages of muxes wherein:

the input to the first stage is the plurality of input clock signals;

at least one stage is adapted to (i) receive a plurality of clock signals, (ii) drop at least the first or the last clock signal of the received plurality of clock signals, and (iii) output a reduced plurality of clock signals; and the output of the last stage is the set of candidate clock signals.

41. The invention of claim 40, wherein:
each input clock signal is routed to only two first-stage mux inputs; and
the two first-stage mux inputs correspond to the same mux.

42. The invention of claim 40, wherein:
each input clock signal is routed to only two first-stage mux inputs; and
the two first-stage mux inputs correspond to different muxes.

43. The invention of claim 40, wherein the first stage comprises 4 muxes, each first-stage mux receiving, in forward order at one input and in reverse order at the other input, a different quadrant comprising one-fourth of the input clock signals;

and further comprising:

a second stage comprising 2 muxes, the first second-stage mux receiving outputs from the two first-stage muxes corresponding to the first and third quadrants, and the second second-stage mux receiving outputs from the two first-stage muxes corresponding to the second and fourth quadrants.

44. The invention of claim 40, wherein the clock signals in the set of candidate clock signals are consecutive.

45. A clock selector for selecting a set of candidate clock signals from among a plurality of input clock signals, the clock selector comprising:

control logic adapted to generate a plurality of control signals; and a plurality of muxes controlled by the control signals and arranged in two or more stages comprising at least a first stage and a last stage, each stage receiving an input and providing an output;

wherein:

the input to the first stage is the plurality of input clock signals;

at least one stage is adapted to (i) receive a plurality of clock signals, (ii) drop at least the first or the last clock signal of the received plurality of clock signals, and (iii) output a reduced plurality of clock signals;

the output of the last stage is the set of candidate clock signals; and the clock signals in the set of candidate clock signals are consecutive.

46. The invention of claim 45, wherein:

each input clock signal is routed to only two first-stage mux inputs; and the two first-stage mux inputs correspond to the same mux.

47. The invention of claim 45, wherein:

each input clock signal is routed to only two first-stage mux inputs; and the two first-stage mux inputs correspond to different muxes.

48. The invention of claim 45, wherein the first stage comprises 4 muxes, each first-stage mux receiving, in forward order at one input and in reverse order at the other input, a different quadrant comprising one-fourth of the input clock signals;

and further comprising:

a second stage comprising 2 muxes, the first second-stage mux receiving outputs from the two first-stage muxes corresponding to the first and third quadrants, and the second second-stage mux receiving outputs from the two first-stage muxes corresponding to the second and fourth quadrants.

49. A method of selecting a set of candidate clock signals from among a plurality of input clock signals, the method comprising:

generating a plurality of control signals; and controlling a plurality of muxes using the control signals; wherein:

the muxes are arranged in two or more stages comprising at least a first stage and a last stage, each stage receiving an input and providing an output;

the input to the first stage is the plurality of input clock signals;

at least one stage is adapted to (i) receive a plurality of clock signals, (ii) drop at least the first or the last clock signal of the received plurality of clock signals, and (iii) output a reduced plurality of clock signals; and the output of the last stage is the set of candidate clock signals;

and further comprising:

generating the control signals based on a received starting phase number k representing the $k^{th}$ input clock signal.

50. The invention of claim 49, further comprising routing each input clock signal to only two first-stage mux inputs.

* * * * *